United States Patent [19]

Althouse

[11] 4,395,451
[45] Jul. 26, 1983

[54] SEMICONDUCTOR WAFER AND DIE HANDLING METHOD AND MEANS

[76] Inventor: Victor E. Althouse, 393 Traverso Ave., Los Altos, Calif. 94022

[21] Appl. No.: 168,031

[22] Filed: Jul. 14, 1980

[51] Int. Cl.$^3$ .................... B32B 3/26; B32B 25/20
[52] U.S. Cl. .................... 428/141; 248/346; 428/156; 428/172; 428/447
[58] Field of Search ............. 428/141, 156, 447, 153, 428/159, 172, 447; 156/662; 248/346

[56] References Cited

U.S. PATENT DOCUMENTS

| | | | |
|---|---|---|---|
| 2,079,273 | 5/1937 | Angier | 428/152 |
| 2,572,470 | 10/1951 | Gordon . | |
| 2,669,535 | 2/1954 | Orr | 428/156 |
| 2,768,902 | 10/1950 | Scholl | 428/141 |
| 4,068,030 | 1/1978 | Witman | 428/172 |

Primary Examiner—Paul J. Thibodeau
Attorney, Agent, or Firm—Victor R. Beckman

[57] ABSTRACT

Semiconductor wafer and die handling method and means are disclosed which include use of a rigid substrate and attached compliant elastomer layer. The outer face of the elastomer layer is texturized to reduce the interfacial forces between said layer and semiconductors supported thereon sufficiently to allow for removal of the semiconductors by conventional means. Friction forces between the texturized layer and semiconductors and remaining interfacial forces are sufficiently high to prevent undesired movement of semiconductors relative to the supporting layer during handling. The elastomer layer may be bonded to the substrate, or attached thereto by interfacial forces between smooth abutting substrate and elastomer layer surfaces. Among other things, the compliant elastomer layer may be included in the construction of a shipping container for semiconductor chips, wafers, or the like. Texturization of the elastomer surface may be provided by molding using a mold with a texturized surface.

16 Claims, 8 Drawing Figures

SEMICONDUCTOR WAFER AND DIE HANDLING METHOD AND MEANS

BACKGROUND OF THE INVENTION

The manufacture of semiconductor devices includes a variety of intermediate steps which involve the handling of individual wafers, die, substrates, and the like. Typically, such steps include breaking, sorting, inspection, storage, shipment and related wafer and die handling prior to die and lead bonding, and subsequent die encapsulation. A number of prior art die handling method and means currently are employed, which include the use of non-adhesive carriers, adhesive carriers, and compliant elastomeric retention carriers.

With non-adhesive carriers, die are handled on flat substrates, such as glass plates, or in sized cavities of multiwell trays. Such carriers have a low coefficient of friction with the die. As a result, with a flat glass carrier, the die are easily accidently disoriented on the carrier, or spilled off therefrom. Transportation, or shipment, on such surfaces is difficult. Cavity trays are useful to prevent sliding across the carrier surface. However, the cavities must be properly sized to roughly conform to the die size. Also, die may rotate within the cavity such that precise die orientation is not retained. Further, die edge damage may occur within the cavity during shipment, and die removal from the cavity is sometimes inhibited because of the proximity of the die edge to the cavity wall.

Conventional adhesives are sometimes used to temporarily retain the wafer, or die, on the carrier to facilitate handling thereof. Such adhesives may involve waxes which are inconvenient to handle, and/or adhesives which may leave a residue on the die or wafer which interferes with subsequent processing, such as die bonding. Often, special equipment is required to remove the die from the adhesive substrate. Further, adhesive qualities are not always uniform and are difficult to control, particularly at the low tack levels ordinarily required.

Compliant or elastomeric retention carriers include the use of rigid or semirigid substrate having a resilient, rubber-like, layer, such as an elastomer, thereon for support of the die. Wafers and die are tightly held in position on the carrier by frictional and interfacial forces, rather than by adhesive forces. These carriers have several advantages in that they leave no adhesive residues, they are flat and therefor do not inhibit access to the die as by a vacuum collet or tweezer, and they do nor require an array of die-sized cavities for support of different sized die. However, while die retention using such an elastomeric surface is favorable, die removal presents substantial difficulties. The intimate contact between the smooth die surface and smooth elastomer surface causes the die to "stick" to the carrier. Frictional engagement is desirably high if one attempts to slide the die off from the carrier, but a partial vacuum tends to be created between the die and carrier if an attempt is made to lift the article from the carrier. Consequently, the die cannot readily be removed using conventional tweezers or vacuum techniques.

SUMMARY OF THE INVENTION AND OBJECTS

An object of this invention is the provision of semiconductor die and wafer handling method and means which avoid the above-mentioned and other shortcomings of prior art arrangements.

An object of this invention is the provision of a carrier for handling semiconductor die and wafers upon which the die and wafers are retained in desired position during handling, yet are readily removed from the carrier using conventional techniques.

An object of this invention is the provision of an improved elastomeric retention type carrier and method of making the same, for controlled reduction of interfacial retention forces to allow for removal of articles by conventional means.

The above and other objects and advantages of this invention are achieved by use of a generally rigid substrate having a texturized, relatively soft, layer, or film, of elastomer formed thereon or attached thereto. The substrate may be formed of glass, plastic, or the like and the elastomer layer may be formed directly on the surface of the substrate, or it may be formed separately and then applied to the substrate. The outer face of the elastomer film is texturized to reduce the interfacial retention forces thereof so that die or wafers carried thereon may be removed by conventional means. However, the frictional retention forces are sufficient to prevent the articles from inadvertently moving relative to the carrier during normal handling. The carrier may be incorporated in a shipping container which includes means for exerting a force on the surface of the die or wafers to hold them firmly in position in the container. Surface texturization of the elstomeric film surface may be provided by molding the film on a roughened mold surface. Alternatively, the smooth surface of an elastomeric member may be roughened to provide the member with the desired surface texturization.

BRIEF DESCRIPTION OF THE DRAWINGS

The invention, together with other objects and advantages thereof, will be better understood from the following description considered with the accompanying drawings. In the drawings, wherein like reference characters refer to the same parts in the several views:

Reference first is made to FIGS. 1-3 of the drawings wherein the novel carrier 8 of this invention for use in handling semiconductor chips and/or wafers, or other such smooth-surfaced articles, is shown comprising a base, or substrate, 10 formed of a suitable rigid material, such as glass, plastic, metal, or the like, and having at least one plane face. Attached to the upper plane face of the substrate, or formed thereon, by means not shown, is a thin elastomeric film, or layer, 12 for support of semiconductor wafers, die, or like articles. In FIG. 1, a pair of semiconductor chips 14 are shown resting on the surface of the elastomeric layer 12 of the carrier 8.

Figure 1:
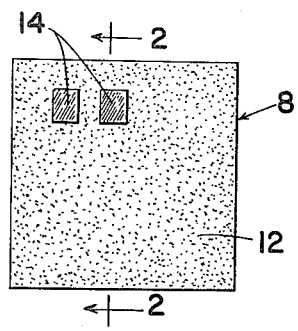
FIG. 1 is a plan view of a carrier embodying the present invention and showing two semiconductor die carried thereby.

In accordance with the present invention the upper free surface of the elastomer layer 12 is texturized to reduce the contact surface between the semiconductor elements 14 and said layer, thereby reducing the interfacial forces therebetween. Frictional forces, however, between the texturized surface and article supported thereon remain sufficiently high so that the semiconductor article does not readily slide over the surface. As noted above, a smooth surface on the elastomeric layer in contact with the smooth surface of a semiconductor element results in such high interfacial retention forces therebetween so as to make removal of the semiconductor element therefrom difficult. Surface texturization, identified by reference character 12A is best seen in the enlarged fragmentary drawing of FIG. 3.

Figure 2:
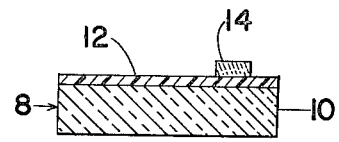
FIG. 2 is a sectional view taken along line 2—2 of FIG. 1.
Figure 3:
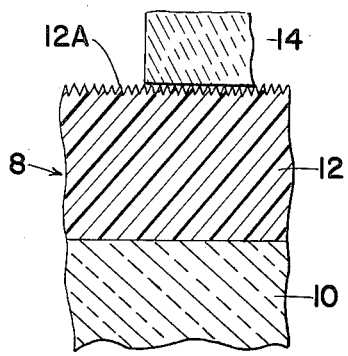
FIG. 3 is an enlarged fragmentary sectional view taken along a portion of line 2—2 and showing the textured surface of the soft compliant film.
Figure 4:
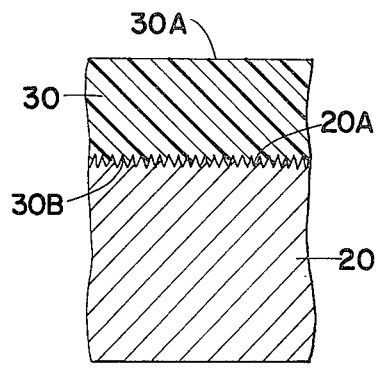
FIG. 4 is an enlarged fragmentary sectional view of a mold for use in forming a surface texturized film of elastomer for use in the present invention.

In the carrier shown in FIGS. 1–3 a random pattern of texturization 12A, is formed on the elastomeric layer 12. Any suitable means for forming the texturized surface may be employed. In FIG. 4, to which reference now is made, a mold 20 is shown having a texturized face 20A. A suitable curable liquid polymer is applied to the texturized face of the mold 20 and cured for production of a compliant elastomer film 30 which is smooth on one face 30A and texturized at the opposite face 30B. If required, a release material, not shown, may be included on the texturized surface of the mold for easy removal of the layer 30 from the mold. The elastomeric film 30 then is attached, with the texturized surface up, to the surface of a suitable rigid substrate, such as substrate 10 shown in FIGS. 2 and 3. The compliant retention forces between the smooth face 30A of the elastomer film and the smooth upper face of the rigid substrate (e.g. substrate 10 shown in FIGS. 1–3) normally are sufficiently great such that no adhesive or other such bonding means are required for attaching the film to the substrate. However, the film may be bonded to the substrate, if desired. Use of an elastomer having a Shore A hardness of from about 15 to about 90 is practical; with a range of hardness between about 30 to 65 Shore A being preferred for best results. In examples contained hereinbelow, silicone elastomer with a Shore A hardness of 35 was employed in the manufacture of the elastomeric layer.

Any suitable means for texturizing the face 20A of the mold 20 may be employed including, for example, mechanical sandblasting, chemical etching, or the like. A mold comprising a sandblasted rigid plastic sheet has been used to form satisfactory compliant elastomer films, in a manner described below.

Figure 5:
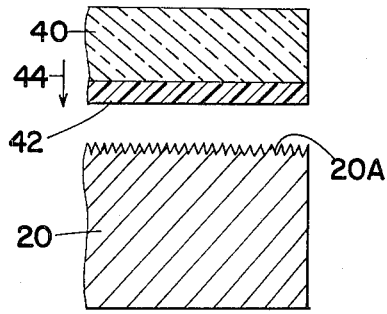
FIG. 5 is an enlarged cross-sectional view of the mold shown in FIG. 4 but used for texturizing a surface film on a substrate.

A modified method of making the novel carrier of this invention is illustrated in FIG. 5. There, a rigid base, or substrate, 40 such as a sheet of plastic, glass, or the like, of desired size is shown, to one face of which an uncured elastomer layer 42 is applied, as by spin coating. The coated side of substrate 40 is placed (in direction of arrow 44) on the texturized surface 20A of the mold 20, and the elastomer 42 is allowed to cure. When cured, the coated substrate is removed from the mold. One surface of the elastomeric layer 42 bonds, or adheres, to the substrate 40 and the opposite free surface thereof takes on the textured surface of the mold 20. The substrate 40 with attached texturized elastomeric layer 42 is used for the support of semiconductor die, chips, wafers, or the like, in the manner shown in FIGS. 1–3 and described above. As noted above, texturization of the elastomeric layer surface functions to satisfactorily retain frictional forces while greatly reducing interfacial forces between the elastomeric layer and die, wafers, or like smooth articles supported thereon.

Figure 6:
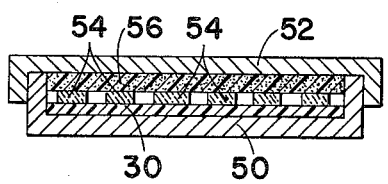
FIG. 6 is a cross sectional view showing use of the novel elastomeric layer of this invention in a shipping container.

The novel carrier of this invention is well adapted for use in a shipping container for shipping semiconductor wafers, die, etc. In FIG. 6, to which reference now is made, there is shown a container, or box, 50 with a cover 52. The inside bottom surface of the box is provided with an elastomeric texturized sheet 30 (produced in the manner described above with reference to FIG. 4). The smooth surface of the elastomeric sheet is tightly adhered to the smooth inner surface of the box bottom by the frictional interfacial forces therebetween. Obviously, if desired, the elastomeric sheet 30 may be bonded to the box bottom by adhesive, or other suitable means, not shown. Semiconductor die 54 are shown resting on the texturized surface of the elastomeric layer 30, and a resilient foam plastic layer 56 is shown placed over the semiconductor die to hold them in place when the cover 52 is attached to the base 50. The force of the foam plastic layer 56 on the die adds to the retention forces between the die and sheet 30 to maintain the die in position on the sheet during handling and/or shipping of the container.

Figure 7:
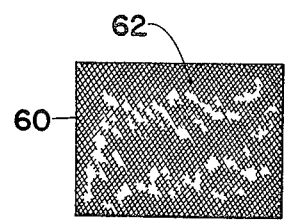
FIG. 7 is a plan view showing a modified form of this invention employing a compliant elastomer having a uniform pattern of texturization.

Instead of irregular texturization, as provided by use of the etched, or sandblasted mold surface, the compliant, elastomeric, sheet may be formed with a regular, uniform, texturization pattern. A mold for such a pattern may be provided, for example, by rows of crossed grooves formed on the face of the mold. An elastomeric sheet 60 formed using such a mold is shown in FIG. 7, wherein the texturized face is shown formed by crossing ribs 62. Obviously, the mold may be provided with a pattern of rows of intrsecting ridges, rather than grooves, in which case the elastomeric layer would be formed with a matrix of raised elements, or islands. It will be apparent that in any method employed in texturizing the elastomer sheet, the amount of texturization may be controlled for control of the coefficient of friction of the sheet and the interfacial retention forces between the die and the texturized surface. In this manner, die, wafers, etc., of different weight, size and surface smoothness, may be accommodated using the present invention.

Figure 8:
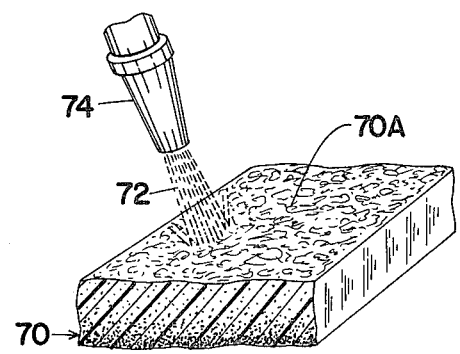
FIG. 8 is a fragmentary perspective view showing texturization of another modified form of carrier embodying the present invention.

A modified form of this invention involves the use of an elastomeric member of suitable thickness to provide the same with the necessary rigidity to prevent excessive bending when handled. The surface of the elastomeric member is texturized to proivde the same with the desired interfacial forces relative to die, wafers, or the like, as described above. In FIG. 8, to which reference now is made, such a generally monolithic carrier 70 is shown. If desired, the elastomeric member may be of a non-uniform hardness, with the bottom portion thereof being harder than the upper portion so as to function as a generally rigid substrate for the upper, softer, material. FIG. 8 also illustrates a modified method of surface texturization, wherein the surface is texturized subsequent to formation of the carrier, rather than during its formation. In FIG. 8, the surface 70A is shown being texturized by sandblasting by directing sand 72, or other abrasive, thereon from a nozzle 74.

Obviously, other means, such as chemical etching, may be used to provide the surface 70A with the desired surface texturization. As noted above, the resultant elastomeric member has sufficient rigidity to function as a carrier for smooth-surfaced articles while providing for the desired retention forces between the articles and texturized surface thereof. As with other arrangements, the surface of the member has a Shore A hardness of between about 15 to about 90, but preferably between about 30 to 65.

In the construction of one form of this invention, a plastic mold with a roughened, texturized, surface formed by sandblasting was employed. Sylgard 184 (Dow-Corning), a curable two part silicone elastomer material wa spun onto a 2" by 2" glass substrate. The substrate then was inverted and placed with the uncured elastomer film on the texturized mold surface. The system was cured in this condition, and the coated glass substrate with attached elastomeric film was separated from the mold. A semiconductor die, approximately 0.100×0.100 inch square, was placed on the texturized elastomer surface, and the carrier was tilted approximately 45° with no movement or rotation of the die relative to said surface. At less than a 90° tilt, the die slid along the carrier face. Removal of the die by vacuum and bu use of a tweezer under normal die handling procedures was readily accomplished.

In a control experiment a glass substrate was coated by spinning with Sylgard 184 elastomeric material and placed on a smooth, non-texturized, mold surface, cured, and then separated from the mold. Die placed on the smooth elastomeric surface was retained in position with the carrier tilted beyond 45° from horizontal, to a vertical position. However, the die could not be removed by tweezer, or vacuum, without significant difficulty or damage to the die. Similar results (i.e. excessive compliant retentin forces) were obtained when the carrier was formed by curing the elastomer on the substrate without inversion onto the smooth mold surface. This resulted from the fact that the elastomer self-leveled to an equivalent smooth condition before curing.

As another example, the same liquid elastomer, Sylgard 184, was cast on a sandblasted texturized plastic mold surface, and cured. The cured elastomeric film was removed from the mold and mounted, texturized surface up, on a glass slide. Die placed on this texturized film did not move relative to the film surface when the carrier was tilted 45°, yet the die were readily removed using a vacuum collet or tweezers.

The invention having been described in detail in accordance with requirements of the Patent Statutes, various other changes and modifications will suggest themselves to those skilled in this art. For example, a texturixed film may be formed by including small particles, such as sand, or the like, in the liquid polymer, to provide a roughened, or texturized elastomeric filn surface when cured. No mold would be required for this texturization operation. Also, although a silicone elastomer is described, it will be apparent that other elastomers may be used in the manufacture of the compliant sheet. While many elastomers lose their desired properties or decompose when used at high temperatues, silicone elastomers retain their physical characteristics when used at high temperatures, which make their use for the present application highly desirable. It is intended that the above and other such changes and modifications shall fall within the spirit and scope of the invention defined in the appended claims.

I claim:
1. A non-adhesive carrier for handling semiconductor articles having a smooth face, said carrier comprising,
   a rigid substrate having a flat upper face,
   a resilient silicone elastomeric sheet having a Shore A hardness of between 15 and to about 90 member attached to the flat upper face of the substrate, said silicone elastomeric sheet member having a flat lower surface attached to the upper flat face of said substrate and having an upper exposed texturized surface for support of semiconductor articles, the texturized upper surface being effective to substantially reduce interfacial forces between said surface and the smooth surface of a semiconductor article supported thereon so that the semiconductor article can be readily removed from said surface.
2. A non-adhesive carrier as defined in claim 1 wherein
   said texturized surface of said silicone elastomeric sheet member is effective to frictionally resist sliding movement of semiconductor articles supported theroen even when said surface is inclined at an angle greater than 45° to a horizontal surface.
3. A non-adhesive carrier as defined in claim 1 wherein said texturized surface comprises a molded surface with texturization formed by a mold.
4. A non-adhesive carrier as defined in claim 1 wherein said texturized surface comprises a random pattern of indentations.
5. A non-adhesive carrier as defined in claim 1 wherein said texturized surface comprises a regular pattern of indentations.
6. A non-adhesive carrier as defined in claim 1 wherein said upper face of said substrate and lower face of said resilient silicone elastomeric sheet member are smooth, said resilient silicone elastomeric sheet member is attached to said substrate by non-adhesive, interfacial, forces between said smooth substrate and silicone elastomeric sheet member surfaces.
7. A non-adhesive carrier as defined in claim 1 wherein said resilient, silicone, elastomeric, sheet member is attached to said substrate by adhesive bonding.
8. A sheet material for attachment to a plane upper surface of a rigid base member for use in handling or shipping semiconductor articles which have smooth faces, said sheet material comprising,
   a resilient silicone elastomer having a Shore A hardness of between 15 to about 90 having one flat surface for attachment to the plane upper surface of a rigid base member and an opposite texturized outer surface for support of semiconductor articles, the texturized surface of the silicone elastomer being effective to substantially reduce interfacial forces between said surface and the smooth faces of semiconductor articles supported thereon while retaining frictional forces therebetween.
9. A sheet material as defined in claim 8 wherein said texturized surface is effective to frictionally resist sliding movement of semiconductor articles supported thereon even when said surface is inclined at an angle of greater than 45° to a horizontal surface.
10. A sheet material as defined in claim 8 wherein said texturized surface comprises a mold-formed surface.
11. A sheet material as defined in claim 8 wherein said texturized surface is of a random pattern.
12. A sheet material as defined in claim 8 wherein said texturized surface is of a regular pattern.

13. A sheet material as defined in claim 8 wherein said one surface of said elastomer is smooth for attachment by interfacial vacuum forces to a smooth upper surface of a base member.

14. A non-adhesive carrier for handling semiconductor articles, which semiconductor articles have a smooth face, said carrier comprising, rigid means having a flat upper texturized surface formed of resilient silicone elastomeric material having a Shore A hardness of between 15 to about 90 for support of semiconductor articles thereon, texturization of said flat upper surface being of a degree to substantially reduce interfacial forces between said surface and the smooth surface of the semiconductor article supported thereon to facilitate removal of said article from said surface by use of conventional semiconductor handling means.

15. A non-adhesive carrier as defined in claim 14 wherein said texturized surface of said silicone elastomeric material is effective to frictionally resist sliding movement of semiconductor articles supported thereon even when said surface is inclined at an angle greater than 45° to a horizontal surface.

16. A non-adhesive carrier as defined in claim 14 wherein said rigid means comprises a unitary body of resilient silicone elastomeric material of sufficient thickness to lend rigidity thereto.

* * * * *